US 6,716,651 B2

(12) United States Patent
Weng et al.

(10) Patent No.: US 6,716,651 B2
(45) Date of Patent: Apr. 6, 2004

(54) METHOD AND APPARATUS FOR IDENTIFYING A WAFER CASSETTE

(75) Inventors: Martin Weng, Hsin-Chu (TW); Yu-Chih Huang, Hsin-Chu (TW); Jung Huang Peng, Tainan (TW); Robin Lien, Hsin-Chu (TW)

(73) Assignee: Taiwan Semiconductor Manufacturing Co., Ltd, Hsin Chu (TW)

( * ) Notice: Subject to any disclaimer, the term of this patent is extended or adjusted under 35 U.S.C. 154(b) by 152 days.

(21) Appl. No.: 10/132,433

(22) Filed: Apr. 25, 2002

(65) Prior Publication Data

US 2003/0202866 A1 Oct. 30, 2003

(51) Int. Cl.⁷ .............................................. H01L 21/66
(52) U.S. Cl. ...................... 438/14; 414/217.1; 29/25.01
(58) Field of Search .................... 438/11, 14; 414/805, 414/217.1, 217; 33/645

(56) References Cited

U.S. PATENT DOCUMENTS

| | | | | | |
|---|---|---|---|---|---|
| 6,453,574 B1 | * | 9/2002 | Chen | ........................... | 33/645 |
| 6,533,101 B2 | * | 3/2003 | Bonora et al. | ........... | 198/465.1 |
| 6,579,149 B2 | * | 6/2003 | Lebel et al. | .................... | 451/6 |
| 6,591,162 B1 | * | 7/2003 | Martin | ........................ | 700/228 |
| 2002/0114684 A1 | * | 8/2002 | Jeong et al. | ............. | 414/217.1 |
| 2002/0197136 A1 | * | 12/2002 | Huang et al. | ................ | 414/217 |
| 2003/0198553 A1 | * | 10/2003 | Lin et al. | ..................... | 414/805 |

* cited by examiner

*Primary Examiner*—W. David Coleman
(74) *Attorney, Agent, or Firm*—Tung & Associates

(57) ABSTRACT

A wafer/loadport assembly that has a built-in, self-identification system and a method for operating the assembly are described. The wafer cassette is equipped with recessed holes provided with electrically conductive plates for contacting locating pins on a loadport wherein the locating pins are provided with electrically conductive tips for allowing a current to flow through the plate. By different combinations of the electrically conductive tips and the electrically conductive plates provided in the recess holes, the type of wafer cassette can be determined and identified by the process controller.

20 Claims, 4 Drawing Sheets

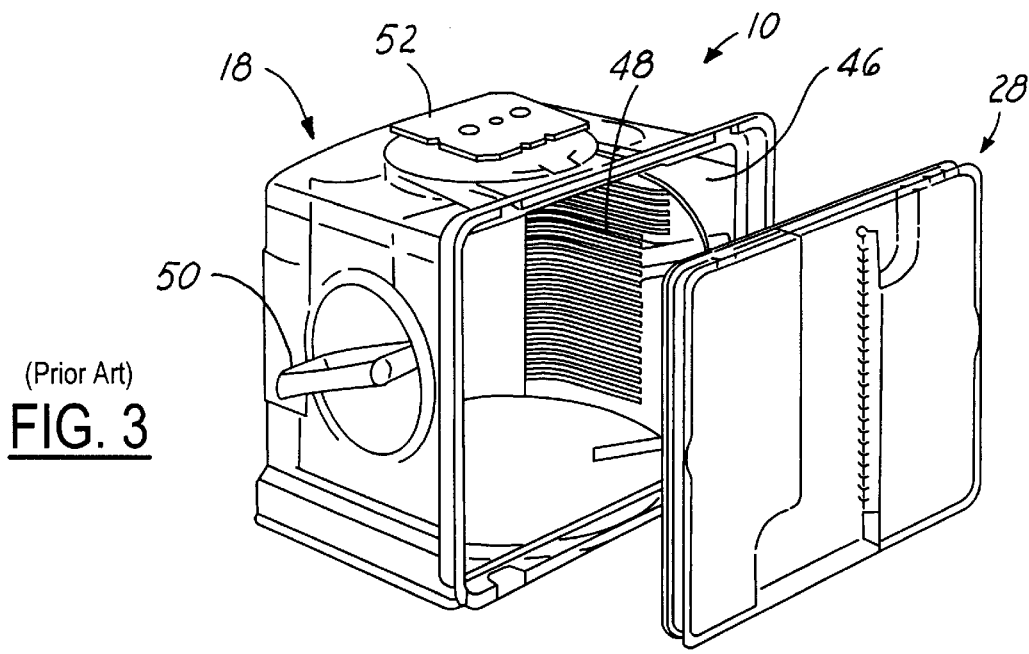
(Prior Art)
FIG. 3
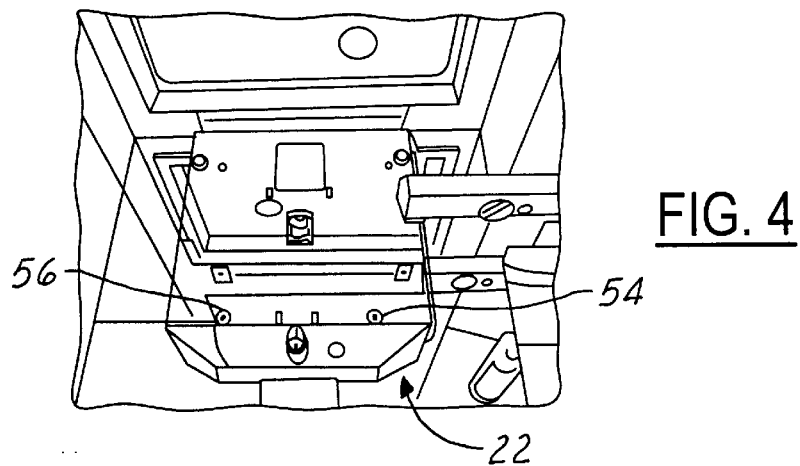
FIG. 4
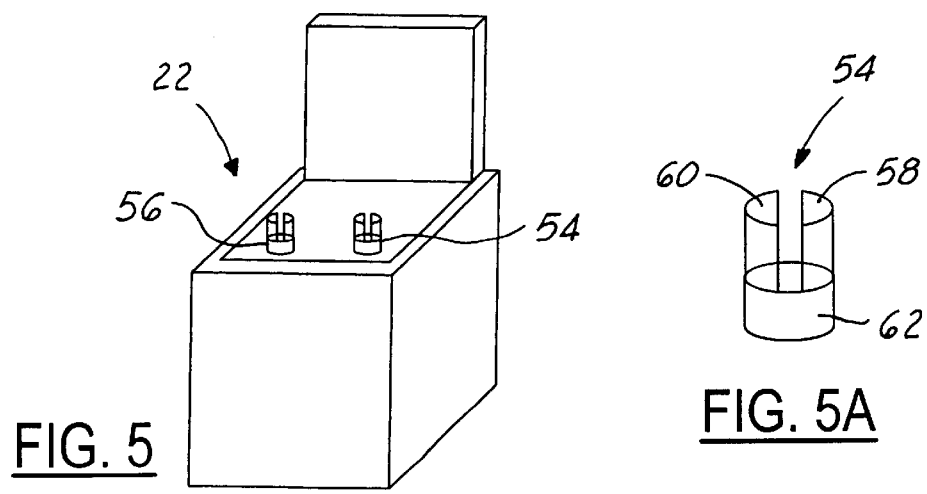
FIG. 5
FIG. 5A

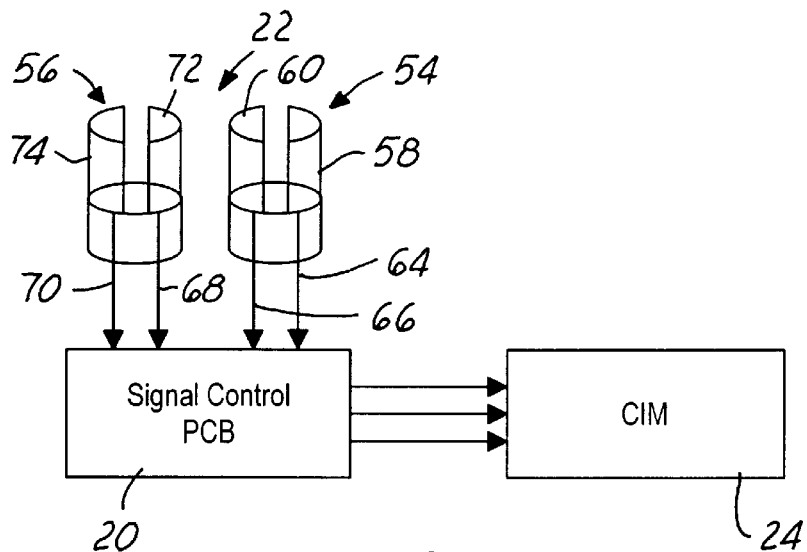
FIG. 6
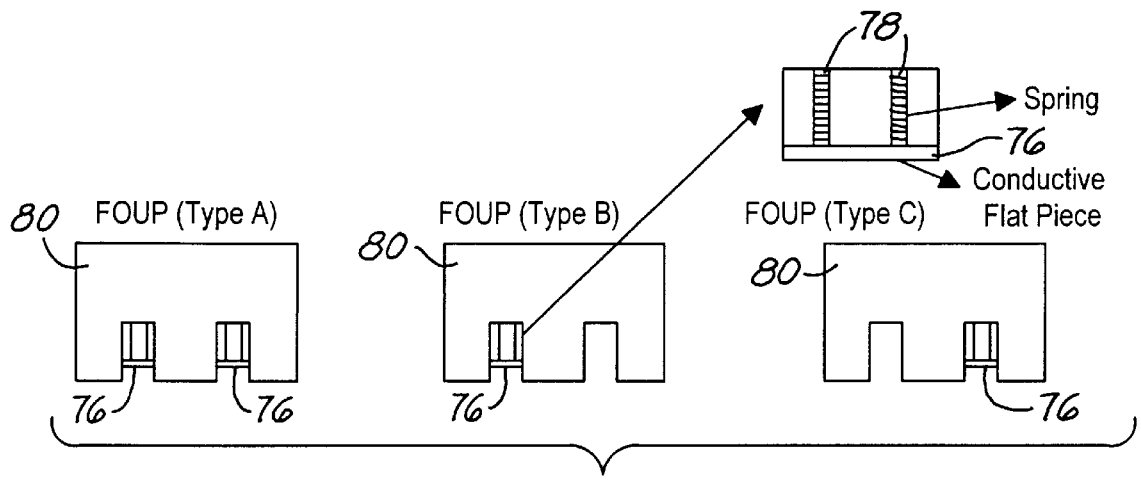
FIG. 7
| Process | P in A | P in B |
|---------|--------|--------|
| Normal  | Low    | High   |
| Copper  | High   | Low    |
| Cobalt  | High   | High   |
FIG. 8

METHOD AND APPARATUS FOR IDENTIFYING A WAFER CASSETTE

FIELD OF THE INVENTION

The present invention generally relates to a wafer cassette/loadport assembly used on a microelectronic fabrication equipment and a method of using and more particularly, relates to a wafer cassette/loadport assembly with a built-in self-identification function and a method for operating the assembly.

BACKGROUND OF THE INVENTION

The conveying of a semiconductor wafer is important in the manufacturing of integrated circuit chips due to the delicate nature of the wafer. In fabricating an IC product, a multiplicity of fabrication steps, i.e. as many as several hundred, is required to complete the fabrication process. A semiconductor wafer or IC chips must be transported between various process stations in order to perform various fabrication processes.

For instance, to complete the fabrication of an IC chip, various steps of deposition, cleaning, ion implantation, etching and passivation steps must be carried out before an IC chip is packaged for shipment. Each of these fabrication steps must be performed in a different process machine, i.e. a chemical vapor 7 deposition chamber, an ion implantation chamber, an etcher, etc. A partially processed semiconductor wafer must be conveyed between various work stations many times before the fabrication process is completed. The safe conveying and accurate tracking of such semiconductor wafers or work-in-process parts in a semiconductor fabrication facility is therefore an important aspect of the total fabrication process.

Conventionally, partially finished semiconductor wafers or WIP parts are conveyed in a fabrication plant by automatically guided vehicles or overhead transport vehicles that travel on predetermined routes or tracks. For the conveying of semiconductor wafers, the wafers are normally loaded into cassettes pods, such as SMIF (standard machine interface) or FOUP (front opening unified pod), and then picked up and placed in the automatic conveying vehicles. For identifying and locating the various semiconductor wafers or WIP parts being transported, the cassettes or pods are normally labeled with a tag positioned on the side of the cassette or pod. The tags can be read automatically by a tag reader that is mounted on the guard rails of the conveying vehicle.

In modern semiconductor fabrication facilities, especially for the 200 mm or 300 mm fabrication plants, automatic guided vehicles (AGV) and overhead hoist transport (OHT) are extensively used to automate the wafer transport process as much as possible. The AGV and OHT utilize the input/output ports of a stocker to load or unload wafer lots, i.e. normally stored in FOUFs. FIG. 1 is a perspective view of an overhead hoist transport system 32 consisting of two vehicles 34, 36 that travel on a track 38. An input port 40 and an output port 42 are provided on a stocker 30. As shown in FIG. 1, the overhead transport vehicle 36 stops at a position for unloading a FOUP 44 into the input port 40. The second overhead transport vehicle 34 waits on track 38 for input from stocker 30 until the first overhead transport vehicle 36 moves out of the way.

Similarly, the OHT system is used to deliver a cassette pod such as a FOUP to a process machine. This is shown in FIG. 2. A cassette pod 10 of the FOUP type is positioned on a loadport 12 of a process machine 14. The loadport 12 is equipped with a plurality of locating pins 16 for the proper positioning of the cassette pod 10. A detailed perspective view of the FOUP 10 is shown in FIG. 3. The FOUP 10 is constructed by a body portion 18 and a cover portion 28. The body portion 18 is provided with a cavity 46 equipped with a multiplicity of partitions 48 for the positioning of 25 wafers of the 300 mm size. The body portion 18 is further provided with sloped handles 50 on both sides of the body for ease of transporting. On top of the body portion 18, is provided with a plate member 52 for gripping by a transport arm (not shown) of the OHT system (not shown).

When a wafer cassette is loaded onto a loadport of a process machine, problems occur when the cassette is not correctly identified leading to serious cross-contamination problems for the wafers contained in the cassette. For instance, in the same intra-bay, there may be twenty or thirty process machines each used for depositing a different material layer, for instance, the chemical vapor deposition of silicon oxide, polysilicon, copper or cobalt. When a wafer cassette, such as a FOUP is positioned on the wrong process machine that is setup for the deposition of a different material, the resulting contamination on wafers can be detrimental and extremely difficult to correct.

It is therefore an object of the present invention to provide a wafer cassette/loadport assembly that does not have the drawbacks or shortcomings of the conventional wafer cassette/loadport assemblies.

It is another object of the present invention to provide a wafer cassette/loadport assembly that is equipped with a built-in self-identification system.

It is a further object of the present invention to provide a wafer cassette/loadport assembly that is capable of self-identifying the type of wafer cassette placed on the loadport of a process machine.

It is another further object of the present invention to provide a wafer cassette/loadport assembly that has built-in, self-identification system for feeding information on the wafer cassette into a process controller.

It is still another object of the present invention to provide a wafer cassette/loadport assembly that has a built-in, self-identification system by providing conductive pins on the loadport as locating pins.

It is yet another object of the present invention to provide a method for identifying a wafer cassette that is positioned on a loadport by utilizing a built-in, self-identification system.

It is still another further object of the present invention to provide a method for identifying a wafer cassette positioned on a loadport by feeding information on the wafer cassette into a process controller and comparing to data stored therein.

SUMMARY OF THE INVENTION

In accordance with the present invention, an apparatus and a method for identifying a wafer cassette by a built-in, self-identification system are provided.

In a preferred embodiment, a wafer cassette/loadport assembly that has a built-in, self-identification system is provided which includes a wafer cassette equipped with a bottom plate having at least two recessed holes in a bottom surface of the plate, at least one of the at least two recessed holes is provided with a spring-loaded, laterally positioned, electrically conductive plate adapted to engage one of at least two pins situated on a top surface of a loadport; a loadport equipped with at least two pins on a top surface in positions that are in mirror image to the two recessed holes in the wafer cassette when the wafer cassette is placed on top of the loadport, each of the at least two pins is provided with two electrically conductive tips that are spaced-apart and electrically insulated from each other, the two tips are adapted to conduct electricity therein between when pressed against and intimately contact the spring-loaded, electrically conductive plate in one of the at least two recessed holes upon engagement between the loadport and the wafer cassette thereby sending an electrical signal to a process controller identifying the wafer cassette.

The wafer cassette/loadport assembly that has built-in, self-identification system may further include a process controller for receiving the electrical signal from the loadport and comparing to pre-stored data in the process controller. A number of the at least two recessed holes on the wafer cassette equals a number of the at least two pins on top of the loadport. The at least two pins on a top surface of the loadport are locating pins. The two electrically conductive tips are formed of aluminum, stainless steel or copper. The two electrically conductive tips are each connected by a lead wire for sending signals to the process controller, and each formed in a cylindrical-shaped rod, or each formed in a half-circular columnar shape. The two electrically conductive tips are each supported by a common base formed of an electrically insulating material, such as a ceramic or a non-conductive plastic. The wafer cassette may have two recessed holes and both recessed holes are equipped with the spring-loaded, laterally positioned, electrically conductive plate. The wafer cassette may further have two recessed holes wherein only one of the two holes is equipped with the spring-loaded, laterally positioned, electrically conductive plate.

The present invention is further directed to a method for identifying a wafer cassette positioned on a loadport which can be carried out by the operating steps of providing a wafer cassette that is equipped with a bottom plate that has at least two recessed holes in a bottom surface of the plate, at least one of the at least two recessed holes is provided with a spring-loaded, laterally positioned, electrically conductive plate adapted to engage one of the at least two pins situated on a top surface of a loadport; providing a loadport equipped with at least two pins on a top surface in positions that are in mirror image to the two recessed holes in the wafer cassette when the wafer cassette is placed on top of the loadport, each of the at least two pins is provided with two electrically conductive tips that are spaced-apart and electrically insulated from each other, the two tips are adapted to conduct electricity therein between when pressed against and intimately contact the spring-loaded, electrically conductive plate in one of the at least two recessed holes upon engagement between the loadport and the wafer cassette; and sending an electrical signal from the loadport to a process controller identifying the wafer cassette.

The method for identifying a wafer cassette positioned on a loadport may further include the step of providing two recessed holes each equipped with a spring-loaded, laterally positioned, electrically conductive plate. The method may further include the step of providing two recessed holes wherein only one is equipped with a spring-loaded, laterally positioned, electrically conductive plate. The method may further include the step of forming the two electrically conductive tips in aluminum, stainless steel or copper. The method may further include the step of forming the two electrically conductive tips in a cylindrical-shaped rod, or in half-circular columnar shape. The method may further include the step of forming the two electrically conductive tips on a common base formed of an electrically insulating material, such as a ceramic or a non-conductive plastic.

BRIEF DESCRIPTION OF THE DRAWINGS

These and other objects, features and advantages of the present invention will become apparent from the following detailed description and the appended drawings in which:

FIG. 3 is a perspective view of a front opening unified pod (FOUP).

FIG. 4 is a top view of a loadport of the present invention equipped with electrically conductive locating pins.

FIG. 5 is a schematic of a perspective view of the present invention loadport equipped with the electrically conductive locating pins.

FIG. 5A is an enlarged, perspective view of a present invention electrically conductive locating pin.

FIG. 6 is a schematic illustrating the present invention electrically conductive locating pins in electrical communication with a signal control printed circuit board and a computer integrated manufacturing (CIM) system.

FIG. 7 is a schematic illustrating different variations of the present invention FOUP design with or without conductive plates in the recessed holes.

FIG. 8 is a table illustrating the different variations of the present invention identification pins.

DETAILED DESCRIPTION OF THE PREFERRED EMBODIMENT

Figure 1:
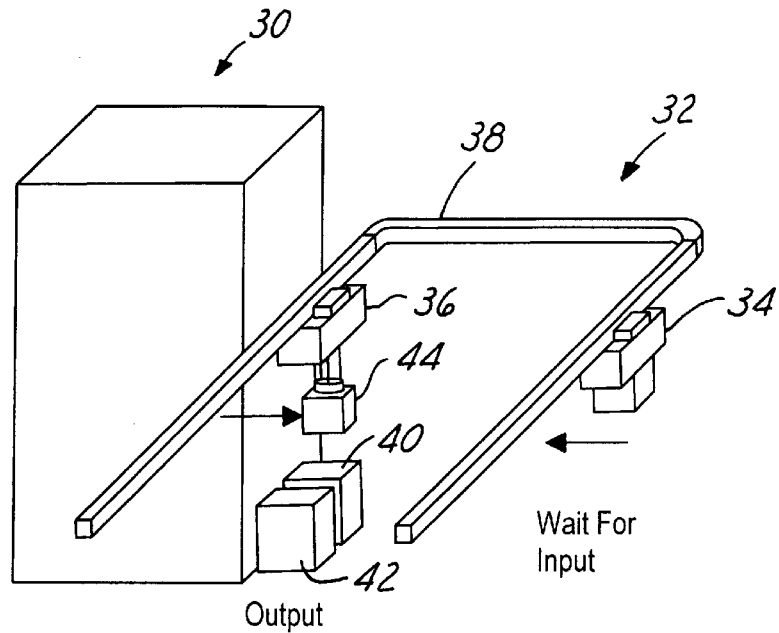
FIG. 1 is a schematic illustration of a conventional overhead hoist transport system for accessing a stocker.
Figure 2:
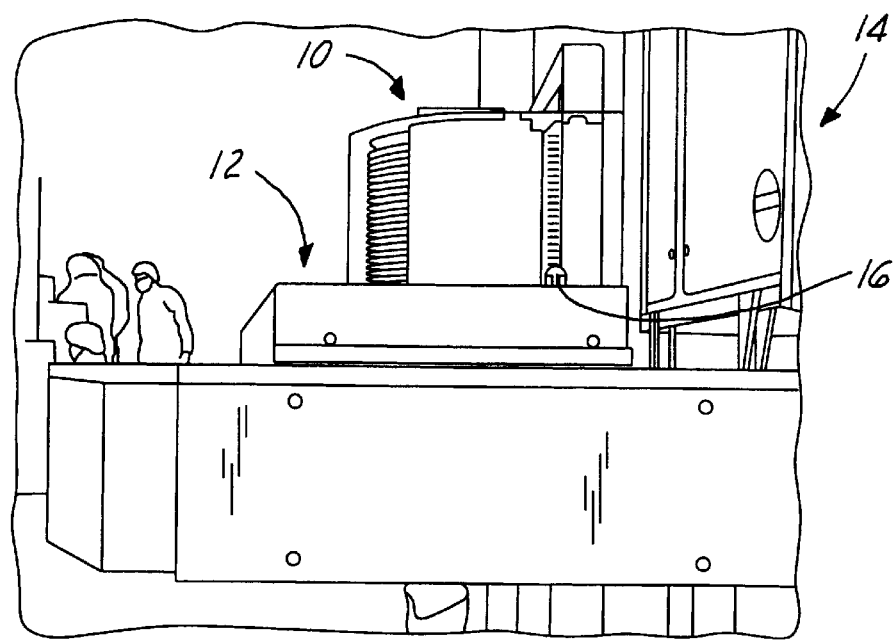
FIG. 2 is a graph illustrating a cassette pod positioned on a loadport of a process machine.

The present invention discloses an apparatus and a method for identifying a wafer cassette mounted on a loadport of a process machine in an automated manner.

A wafer cassette/loadport assembly that is equipped with a built-in, self-identification system is provided by the invention which includes two major components of a wafer cassette and a loadport. The wafer cassette is equipped with a bottom plate that has two recessed holes, in a preferred embodiment, provided in a bottom surface of the plate. At least one of the two recessed holes is provided with a spring-loaded, laterally positioned, electrically conductive plate adapted to engage one of two pins situated on a top surface of a loadport onto which the wafer cassette is to be positioned. The loadport is equipped with two pins, in a preferred embodiment, on a top surface in positions that are in mirror image to the two recessed holes in the wafer cassette when the cassette and the loadport are engaged together. Each of the two pins are provided with two electrically conductive tips that are spaced-apart and electrically insulated from each other, the two tips are adapted to conduct electricity therein between when pressed against and intimately contacts the spring-loaded, electrically conductive plate in one of the two recessed holes upon engagement between the loadport and the cassette thereby sending an electrical signal to a process controller identifying the wafer cassette.

While two recessed holes in the bottom plate of the wafer cassette and two locating pins on the loadport are provided in the preferred embodiment, the present invention novel method can be used to provide any suitable number of recessed holes or locating pins. As a matter of fact, the larger the number of the different varieties of wafer cassettes are to be identified, the larger numbers of the recessed holes and the locating pins are required. For instance, when only two recessed holes and two locating pins are utilized, a total number of four different types of wafer cassettes can be identified. This is achieved by: 1) providing electrically conductive plates in both recessed holes, 2) providing one electrically conductive plate in the left recessed hole; 3) providing one electrically conductive plate in the right recessed hole; and 4) leave both recessed holes empty without the electrically conductive plate. When three recessed holes and three locating pins are utilized, at least nine different types of wafer cassettes can be identified accordingly.

In the present invention apparatus, when a wafer cassette such as a FOUP is placed on the loadport, the electrically conductive plate in each of the recessed holes touches the two conductive tips of the locating pins, and thus enable a signal control unit 20 (shown in FIG. 6) to send a signal from the loadport 22 (FIG. 4) to a CIM (computer integrated manufacturing) controller 24 for comparing to pre-stored data and determine the type of FOUP positioned thereon.

Referring now to FIG. 4, wherein a present invention loadport 22 equipped with the conductive locating pins 54,56 is shown. A perspective view of the loadport 22 is shown in FIGS. 5 and 5A. An enlarged, perspective view of the locating pin 54 is shown in FIG. 5A with two spaced-apart electrically conductive tips 58, 60 mounted on a common base 62 that is electrically insulating. The electrically conductive tips 58, 60 can be formed in either a half-circular columnar shape, as shown in FIG. 5A, or can be fabricated in a cylindrical-shaped rod (not shown). In the preferred embodiment, the electrically conductive tips can be suitably formed of aluminum, stainless steel, copper or any other suitable conductive metal or plastic. The common base 62 may be formed of an electrically non-conductive material such as a ceramic or a non-conductive plastic material. It is desirable that the two electrically conductive tips 58,60 are spaced-apart with a gap therein between of at least 5 mm or larger to provide suitable electrical insulation.

The operation of the present invention novel apparatus can be shown in FIGS. 6~10. FIG. 6 illustrates the electrical connections of the present invention electrically conductive tips 54,56 with a signal control board 20 and a CIM controller 24. As shown in FIG. 6, the electrically conductive locating pin 54 is electrically connected to the signal control printed circuit board 20 by two lead wires 64, 66 each connected to the electrically conductive tip 58, 60, respectively. Similarly, lead wires 68, 70 provide electrical connection to the two conductive tip 72, 74 of the locating pin 56. The signals are received by the printed circuit board 20 and then sent to the CIM controller 24 for comparing to pre-stored data, and thus determining what type of FOUP is positioned on the loadport. This can be shown to the machine operator by either a printout or a display on a display panel, and may even be used to trigger an alarm signal if the wrong type of FOUP is positioned on the loadport.

FIG. 7 illustrates three different types of FOUP bottom plates, wherein the type that does not have any electrically conductive plate installed therein is not shown. For instance, in Type A, both recessed holes are provided with electrically conductive plate 76. In Type B, only the left side recess hole is provided with a conductive plate 76, while in Type C only the right side recessed hole is provided with a conductive plate 76. It is also shown that the conductive plate 76 is spring-loaded by springs 78.

FIG. 8 illustrates three different types of FOUP that can be identified by the arrangement shown in FIG. 7, i.e. wafers that are processed in a normal process, wafers that are processed for a special copper process, and wafers that are processed in a special cobalt process. The two pins show high resistance or low resistance depending on whether there is an electrical current flown therethrough.

Figure 9:
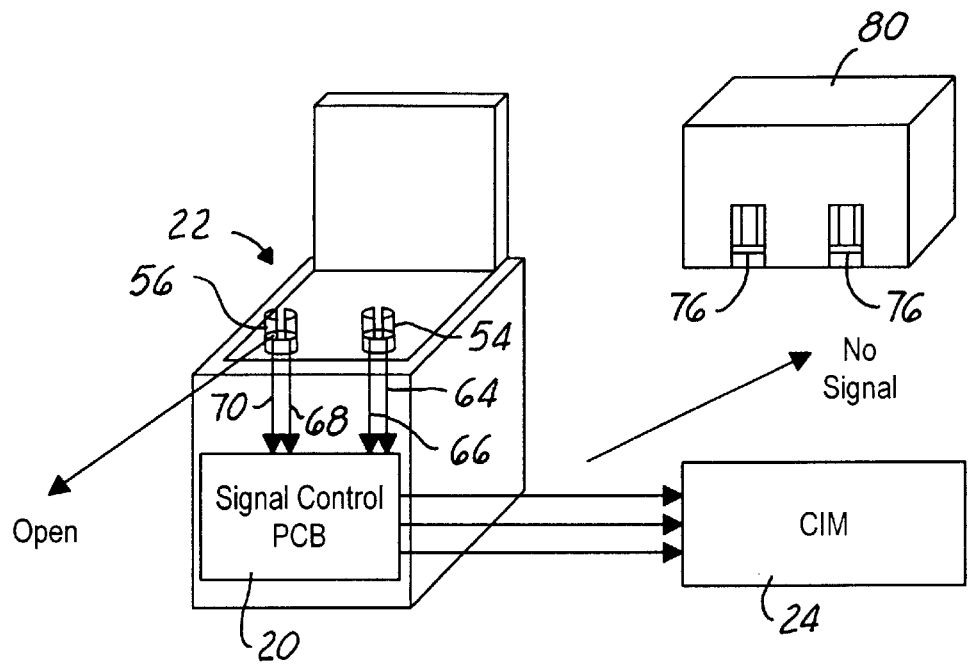
FIG. 9 is a schematic illustrating the operation of the present invention self-identification system prior to the wafer cassette installation on the loadport.
Figure 10:
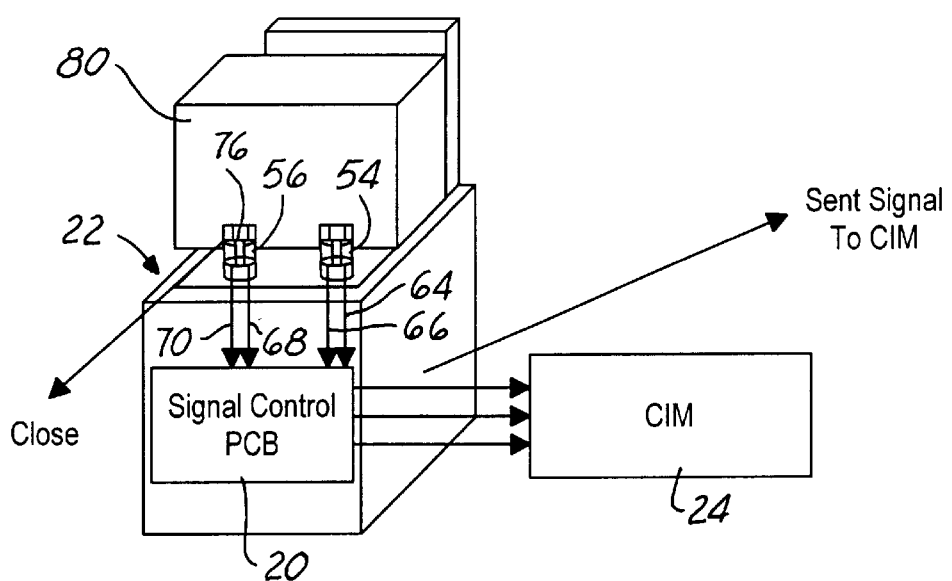
FIG. 10 is a schematic illustrating the operation of the present invention self-identification system after the wafer cassette is installed on the loadport.

FIGS. 9 and 10 illustrate the operation of the present invention novel apparatus. For instance, FIG. 9 shows that when the FOUP 80 is not positioned on the loadport 22 to engage the locating pins 54, 56, there is no signal being sent to the CIM controller 24. To the contrary, when the FOUP 80 is positioned on top of the loadport 22, shown in FIG. 10, signals are being sent from the PCB 20 to the CIM 24 to identify the type of FOUP 80 positioned on top of the loadport 22.

The present invention novel wafer cassette/loadport assembly that has a built-in, self-identification system for identifying a wafer cassette positioned on a loadport have therefore been amply described in the above description and in the appended drawings of FIGS. 4~10.

While the present invention has been described in an illustrative manner, it should be understood that the terminology used is intended to be in a nature of words of description rather than of limitation.

Furthermore, while the present invention has been described in terms of a preferred embodiment, it is to be appreciated that those skilled in the art will readily apply these teachings to other possible variations of the inventions.

The embodiment of the invention in which an exclusive property or privilege is claimed are defined as follows.

What is claimed is:

1. A wafer cassette/loadport assembly with self-identification function comprising:
   a wafer cassette equipped with a bottom plate having at least two recessed holes in a bottom surface of the plate, at least one of said at least two recessed holes being provided with a spring-loaded, laterally positioned, electrically conductive plate adapted to engage one of at least two pins situated on a top surface of a loadport; and
   a loadport equipped with at least two pins on a top surface in positions that are in mirror image to said two recessed holes in said wafer cassette when said wafer cassette is placed on top of said loadport, each of said at least two pins being provided with two electrically conductive tips that are spaced-apart and electrically insulated from each other, said two tips being adapted to conduct electricity therein between when pressed against and intimately contacts said spring-loaded, electrically conductive plate in one of said at least two recessed holes upon engagement between said loadport and said wafer cassette thereby sending an electrical signal to a process controller identifying said wafer cassette.

2. A wafer cassette/loadport assembly with self-identification function according to claim 1 further comprising a process controller for receiving said electrical signal from said loadport and comparing to pre-stored data in said process controller.

3. A wafer cassette/loadport assembly with self-identification function according to claim 1, wherein a number of said at least two recessed holes on said wafer cassette equals a number of said at least two pins on top of said loadport.

4. A wafer cassette/loadport assembly with self-identification function according to claim 1, wherein said at least two pins on a top surface of said loadport are locating pins.

5. A wafer cassette/loadport assembly with self-identification function according to claim 1, wherein said two electrically conductive tips are formed of aluminum, stainless steel or copper.

6. A wafer cassette/loadport assembly with self-identification function according to claim 1, wherein said two electrically conductive tips are each connected by a lead wire for sending signals to said process controller.

7. A wafer cassette/loadport assembly with self-identification function according to claim 1, wherein said two electrically conductive tips are each formed in a cylindrical-shaped rod.

8. A wafer cassette/loadport assembly with self-identification function according to claim 1, wherein said two electrically conductive tips are each formed in a half-circular columnar shape.

9. A wafer cassette/loadport assembly with self-identification function according to claim 1, wherein said two electrically conductive tips are each supported on a common base formed of an electrically insulating material.

10. A wafer cassette/loadport assembly with self-identification function according to claim 1, wherein said two electrically conductive tips are each supported on a common base formed of a ceramic or a non-conductive plastic.

11. A wafer cassette/loadport assembly with self-identification function according to claim 1, wherein said wafer cassette having two recessed holes and both recessed holes are equipped with said spring-loaded, laterally positioned, electrically conductive plate.

12. A wafer cassette/loadport assembly with self-identification function according to claim 1, wherein said wafer cassette having two recessed holes and only one of said two recessed holes are equipped with said spring-loaded, laterally positioned, electrically conductive plate.

13. A method for identifying a wafer cassette positioned on a loadport comprising the steps of:

providing a wafer cassette equipped with a bottom plate having at least two recessed holes in a bottom surface of the plate, at least one of said at least two recessed holes being provided with a spring-loaded, laterally positioned, electrically conductive plate adapted to engage one of at least two pins situated on a top surface of a loadport;

providing a loadport equipped with at least two pins on a top surface in positions that are in mirror image to said two recessed holes in said wafer cassette when said wafer cassette is placed on top of said loadport, each of said at least two pins being provided with two electrically conductive tips that are spaced-apart and electrically insulated from each other, said two tips being adapted to conduct electricity therein between when pressed against and intimately contacts said spring-loaded, electrically conductive plate in one of said at least two recessed holes upon engagement between said loadport and said wafer cassette; and sending an electrical signal from said loadport to a process controller identifying said wafer cassette.

14. A method for identifying a wafer cassette positioned on a loadport according to claim 13 further comprising the step of providing two recessed holes each equipped with a spring-loaded, laterally positioned, electrically conductive plate.

15. A method for identifying a wafer cassette positioned on a loadport according to claim 13 further comprising the step of providing two recessed holes wherein only one is equipped with a spring-loaded, laterally positioned, electrically conductive plate.

16. A method for identifying a wafer cassette positioned on a loadport according to claim 13 further comprising the step of forming said two electrically conductive tips in aluminum, stainless steel or copper.

17. A method for identifying a wafer cassette positioned on a loadport according to claim 13 further comprising the step of forming said two electrically conductive tips in a cylindrical-shaped rod.

18. A method for identifying a wafer cassette positioned on a loadport according to claim 13 further comprising the step of forming said two electrically conductive tips in half-circular columnar shape.

19. A method for identifying a wafer cassette positioned on a loadport according to claim 13 further comprising the step of forming said two electrically conductive tips on a common base formed of an electrically insulating material.

20. A method for identifying a wafer cassette positioned on a loadport according to claim 13 further comprising the step of forming said two electrically conductive tips on a common base formed of a ceramic or a non-conductive plastic.

* * * * *